United States Patent
Frey et al.

(10) Patent No.: US 8,941,193 B2
(45) Date of Patent: Jan. 27, 2015

(54) METHOD FOR MANUFACTURING A HYBRID INTEGRATED COMPONENT

(71) Applicants: Jens Frey, Filderstadt (DE); Frank Fischer, Gomaringen (DE)

(72) Inventors: Jens Frey, Filderstadt (DE); Frank Fischer, Gomaringen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/869,428

(22) Filed: Apr. 24, 2013

(65) Prior Publication Data

US 2013/0277774 A1 Oct. 24, 2013

(30) Foreign Application Priority Data

Apr. 24, 2012 (DE) .......................... 10 2012 206 732

(51) Int. Cl.
| | |
|---|---|
| *B81C 3/00* | (2006.01) |
| *B81B 1/00* | (2006.01) |
| *H01L 29/84* | (2006.01) |
| *B81C 1/00* | (2006.01) |
| *B81B 7/00* | (2006.01) |

(52) U.S. Cl.
CPC ............ *B81C 1/00269* (2013.01); *B81B 7/007* (2013.01); *B81C 1/00238* (2013.01); *B81C 2203/0785* (2013.01)

USPC .... 257/415; 257/416; 257/417; 257/E21.002; 257/E21.499; 257/E29.324; 257/E29.347; 438/50; 438/51; 438/53

(58) Field of Classification Search
USPC .......... 257/415, 416, 417, E21.002, E21.499, 257/E29.324, E29.347; 438/50, 51, 53
See application file for complete search history.

(56) References Cited

U.S. PATENT DOCUMENTS

| | | | | |
|---|---|---|---|---|
| 2010/0290199 | A1* | 11/2010 | Schmid et al. ................. | 361/752 |
| 2011/0012247 | A1* | 1/2011 | Wu ................................ | 257/678 |
| 2011/0049652 | A1* | 3/2011 | Wu et al. ........................ | 257/417 |
| 2012/0032283 | A1* | 2/2012 | Frey et al. ...................... | 257/415 |
| 2013/0119492 | A1* | 5/2013 | Feiertag et al. ................ | 257/416 |
| 2014/0103462 | A1* | 4/2014 | Lee et al. ........................ | 257/415 |

* cited by examiner

*Primary Examiner* — Dao H Nguyen
(74) *Attorney, Agent, or Firm* — Kenyon & Kenyon LLP

(57) ABSTRACT

A simple and cost-effective manufacturing method for hybrid integrated components including at least one MEMS element, a cap for the micromechanical structure of the MEMS element, and at least one ASIC substrate, using which a high degree of miniaturization may be achieved. The micromechanical structure of the MEMS element and the cap are manufactured in a layered structure, proceeding from a shared semiconductor substrate, by applying at least one cap layer to a first surface of the semiconductor substrate, and by processing and structuring the semiconductor substrate proceeding from its other second surface, to produce and expose the micromechanical MEMS structure. The semiconductor substrate is then mounted with the MEMS-structured second surface on the ASIC substrate.

7 Claims, 5 Drawing Sheets

METHOD FOR MANUFACTURING A HYBRID INTEGRATED COMPONENT

RELATED APPLICATION INFORMATION

The present application claims priority to and the benefit of German patent application no. 10 2012 206 732.9, which was filed in Germany on Apr. 24, 2012, the disclosure of which is incorporated herein by reference.

FIELD OF THE INVENTION

The present invention relates to a method for manufacturing a hybrid integrated component including at least one MEMS (micro-electromechanical systems) element, a cap for the micromechanical structure of the MEMS element, and at least one ASIC (application specific integrated circuit) substrate.

BACKGROUND INFORMATION

A method for manufacturing a vertically integrated component having an MEMS element, a cap for the micromechanical structure of the MEMS element, and an ASIC substrate is discussed in US 2011/0012247 A1. The method provides that these three elements of the component are manufactured independently of one another and a separate starting substrate is provided for each element. The MEMS substrate is bonded to the ASIC substrate, which is already processed and optionally also structured. According to US 2011/0012247 A1, the processing of the MEMS substrate may take place either before or also only after the installation on the ASIC substrate, but must be completed upon the mounting of the cap substrate. The cap substrate is structured initially in any case, before it is mounted over the micromechanical structure of the MEMS element. The cap substrate is also bonded on the ASIC substrate for this purpose.

The method allows cost-effective mass production of robust components having a micromechanical sensor function and an evaluation circuit, since not only the individual component elements—MEMS element, cap, and ASIC—are manufactured in the wafer composite here, but rather also their assembly is implemented at the wafer level to form a sensor component. The electrical testing of the MEMS functions and the ASIC functions and the balancing of the individual sensor components may also be carried out at the wafer level. This also contributes to a reduction of the manufacturing costs.

Some aspects of the method have certain disadvantages in practice. Thus, the use of three starting substrates during the manufacture of the three component elements causes a relatively high material and processing outlay. In addition, two bonding processes, which are independent of one another and are each relatively complex, must be carried out within the scope of the component assembly. Finally, it is also to be noted that the components thus manufactured have a comparatively large structural height.

SUMMARY OF THE INVENTION

The present invention provides a simple and cost-effective manufacturing method for hybrid integrated components including at least one MEMS element, a cap for the micromechanical structure of the MEMS element, and at least one ASIC substrate, using which a high degree of miniaturization may be achieved.

Since the method according to the present invention is suitable in particular for manufacturing inertial sensors, such as acceleration sensors and yaw rate sensors, the present invention will be described hereafter on the example of such a component, although components having another function may also be manufactured with the aid of the method according to the present invention. In the case of an inertial sensor, the micromechanical structure of the MEMS element includes at least one seismic mass, which is elastically suspended inside the micromechanical structure so that it is deflected due to accelerations. These accelerations may also be induced by centrifugal forces or rotational movements. The deflections of the seismic mass are detected and analyzed. The component must be equipped, on the one hand, with a switching arrangement for signal detection for this purpose, for example, with the electrodes of a measuring capacitor or with piezoresistors. On the other hand, an evaluation circuit is required for processing and analyzing the measuring signals. In addition, the micromechanical structure of the MEMS is to be capped. Defined pressure conditions may thus be provided for the sensor structure, which substantially also determines the damping behavior of the sensor. In addition, the micromechanical structure of the MEMS element is protected in this way against contaminants and external influences, such as moisture, foreign gases, and particles.

This is achieved according to the present invention in that the micromechanical structure of the MEMS element and the cap are manufactured in a layered structure, proceeding from a shared semiconductor substrate. For this purpose, at least one cap layer is applied to a first surface of the semiconductor substrate. Proceeding from its other, second surface, the semiconductor substrate is processed and structured, to produce and expose the MEMS structure. The semiconductor substrate is then mounted with the MEMS-structured second surface on the ASIC substrate.

In contrast to the method described in US 2011/0012247 A1, the cap is thus produced here in thin-film technology by growing at least one cap layer on a surface of the MEMS substrate. Known semiconductor processes which may be monitored well and are comparatively cost-effective may be used for this purpose. A hermetically sealed composite results between the MEMS substrate and the cap structure also without a bonding process, the structural height of this composite being only slightly greater than the height of the micromechanical structure of the MEMS element.

The manufacturing method according to the present invention may be varied in manifold ways, in particular with regard to the implementation of the cap structure, the implementation of the MEMS structure, and the connection between the MEMS element and the ASIC substrate. The process sequence is not least directed according to the type and purpose of the component to be manufactured.

In a method variant, at least one sacrificial layer is initially applied to the first surface of the semiconductor substrate and structured in such a way that it forms a space holder for a cavity between the MEMS structure still to be produced in the semiconductor substrate and the cap structure still to be produced. In this case, the MEMS structure is first exposed by targeted removal of sacrificial layer material. Since very reliable processes are available for this purpose, with the aid of at least one structured sacrificial layer, the mobility of the micromechanical structure of the MEMS element may be ensured with minimal required cap height. The structured sacrificial layer on the one surface of the semiconductor substrate, which is also referred to hereafter as the MEMS substrate, may additionally advantageously be used as an etch stop during the structuring of the MEMS substrate, since trenches must be produced here, which extend over the entire thickness of the MEMS substrate and open into the cavity below the cap structure.

As already indicated, the cap or cap structure may include multiple cap layers. This opens up the possibility of integrating connecting lines, a rewiring, and/or circuit elements for signal detection, for example, the electrode of a measuring capacitor, into the layered structure of the cap structure. For this purpose, at least one electrically conductive layer is simply accommodated in the layered structure of the cap, structured in a suitable way, and electrically insulated from the adjoining semiconductor material by one or multiple insulating layers.

The starting substrate for the MEMS element is generally significantly thicker than the structural height of the micromechanical structure, which is to be produced in this semiconductor substrate. However, since the MEMS structure is to extend here over the entire thickness of the semiconductor substrate, it is advisable in these cases to initially thin the semiconductor substrate down to the intended structural height of the MEMS structure. The second surface of the semiconductor substrate is advantageously thinned. This surface may specifically already be prepared for the mounting on the ASIC substrate, at least in regard to its roughness.

The MEMS structure may be produced in a trenching process, since trench structures having a particularly high aspect ratio may be produced using this method. The etching attack takes place on the second surface of the semiconductor substrate. For this purpose, this surface is masked accordingly. As already mentioned, it is particularly advantageous if the material of the sacrificial layer on the first surface of the semiconductor substrate was selected in such a way that the structured sacrificial layer forms an etch stop for the trenching process. The etching depth may thus be predefined substantially more precisely than in the case of a solely time-controlled trenching process. Subsequently, the material of the sacrificial layer may simply be removed in a sacrificial layer etching process via the trenches, in order to produce a cavity between the layered structure of the cap and the micromechanical structure in the semiconductor substrate, and expose this cavity.

It is to be noted here that such a cavity between the layered structure of the cap structure and the micromechanical structure in the semiconductor substrate may also be produced without a sacrificial layer, by widening the trenches in the base area in an isotropic etching step until the micromechanical structure is underetched.

The connection between the MEMS element having the cap or cap structure and the ASIC substrate may be established in a bonding process, since in this way both a hermetically sealed mechanical connection and also reliable electrical connections may be implemented between the MEMS element and the ASIC substrate. An array of process variants are available for this purpose, which will be explained in greater detail hereafter in conjunction with the exemplary embodiments of the present invention.

In any case, the final product of the method according to the present invention is a component including at least one MEMS element, a cap for the micromechanical structure of the MEMS element, and at least one ASIC substrate. The micromechanical structure of the MEMS element is implemented in a semiconductor substrate and extends over the entire thickness of the semiconductor substrate. The cap is implemented in a layered structure on this semiconductor substrate and the MEMS element is mounted on the ASIC substrate, so that the micromechanical structure is capped on the one hand by the cap and on the other hand by the ASIC substrate.

Fundamentally, this component structure allows both a second-level assembly in which the component is mechanically fixed on a carrier via the ASIC substrate and electrically contacted, and also a second-level assembly in which the component is mechanically and electrically connected to a carrier via the cap. The implementation of the electrical contacting of the hybrid integrated MEMS element with the outside world is essentially determined by the type of the second-level assembly of the component. In each case, it has proven to be advantageous if the layered structure of the cap includes at least one electrically conductive layer, in which connecting lines of the MEMS element, a rewiring, and/or circuit elements for signal detection are formed. The electrical connection of the hybrid integrated component with the outside world may be established via wire bonds. For this purpose, exposed terminal pads must be provided on the ASIC substrate. In this case, the second-level assembly of the component takes place via the ASIC substrate. The MEMS element and the ASIC substrate may also be electrically connected to the outer package or a circuit board via through contacts in the layered structure of the MEMS element, which extend from the surface of the semiconductor substrate facing toward the ASIC substrate through the semiconductor substrate and the entire layered structure on the semiconductor substrate. This variant also allows a second-level assembly in which the component with the cap is mounted on a carrier via a flip-chip assembly. Alternatively, the MEMS element and the ASIC substrate may be electrically contacted with the outer package or circuit board via through contacts in the ASIC substrate.

It was already explained at the outset that the method and the component structure resulting therefrom are particularly well suited for the implementation of inertial sensors. Since the micromechanical structure of the MEMS element extends according to the present invention over the entire thickness of the semiconductor substrate, relatively large seismic masses may be formed in the sensor structure. The circuit arrangement for detecting the deflections of the seismic mass may—depending on the type of the signal detection—be integrated into the micromechanical structure of the MEMS element, in the cap structure, and/or in the ASIC, while at least parts of an evaluation circuit for the sensor signals are integrated on the ASIC substrate.

As already explained above, there are various possibilities for advantageously implementing and refining the present invention. For this purpose, reference is made, on the one hand, to the patent claims subordinate to the independent patent claims and, on the other hand, to the following description of multiple exemplary embodiments of the present invention on the basis of the figures.

DETAILED DESCRIPTION

The method according to the present invention for manufacturing a hybrid integrated component proceeds from two semiconductor substrates, which are processed independently of one another. At least parts of a signal processing and evaluation circuit for the component are advantageously integrated on the one semiconductor substrate, which is referred to hereafter as the ASIC substrate. Furthermore, through contacts, so-called TSVs (through silicon vias), may be applied in the ASIC substrate, for example, in the form of pocket holes filled with tungsten or copper. These TSVs are used for the external electrical contacting of the component within the scope of the second-level assembly. The CMOS processing of the ASIC substrate is not described in detail here, however, since it is not specified in greater detail by the present invention.

Figure 1:
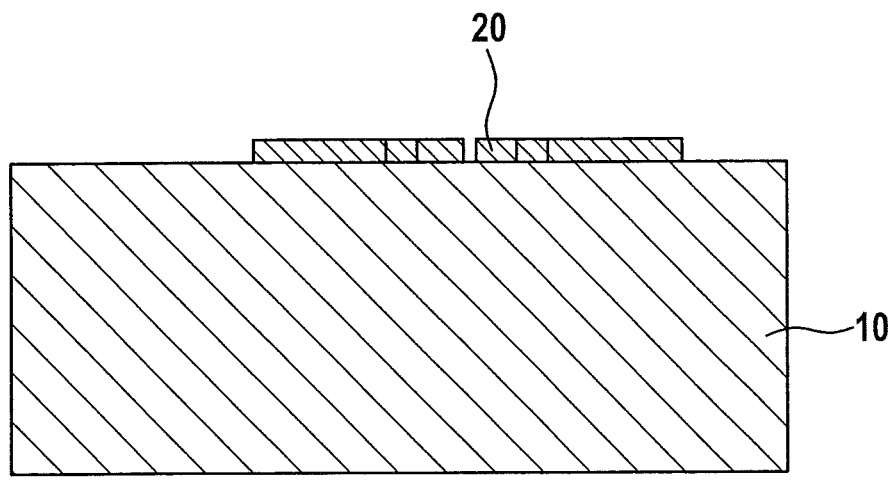
FIGS. 1-7 show the method according to the present invention on the basis of schematic sectional views through the structure of an inertial sensor component during the manufacture.

The other semiconductor substrate 10, which is also referred to hereafter as the MEMS substrate, is shown in FIG. 1. In the exemplary embodiment described here, it is a single-crystal silicon wafer 10. An oxide layer was grown as sacrificial layer 20 on one surface of MEMS substrate 10. This oxide layer 20 may have been produced within the scope of a thermal oxidation; however, it may also have been deposited in a CVD process, an LPCVD process, or a PECVD process on the surface of MEMS substrate 10. Subsequently, oxide layer 20 was structured in order to remove it at defined positions over the micromechanical sensor structure, which is still to be produced, and outside this sensor area. For this purpose, a masking layer is initially applied to closed oxide layer 20 and photolithographically structured. The oxide material is then removed in an etching process from the open areas of the masking layer. FIG. 1 shows unstructured MEMS substrate 10 having structured sacrificial layer 20. Sacrificial layer 20 functions as a space holder for a cavity between the micromechanical sensor structure, which is still to be produced, and a cap structure, which is still to be produced.

Figure 2:
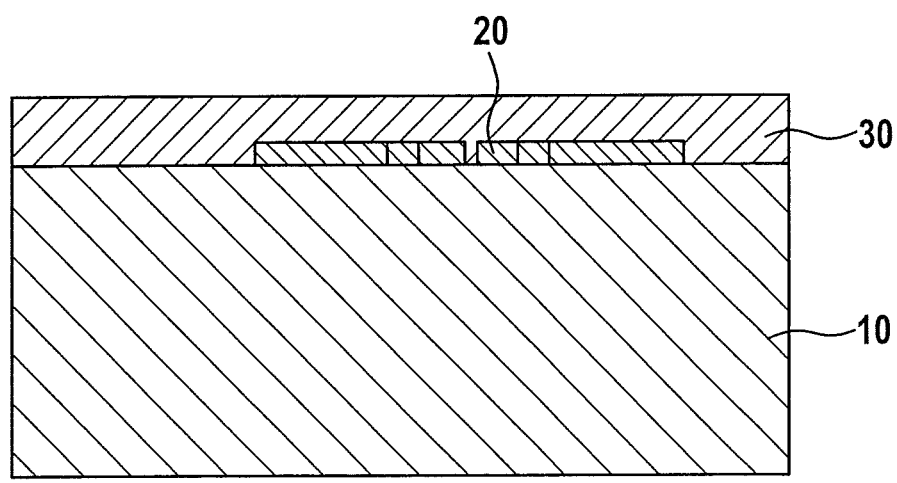

A thick cap layer 30 made of polycrystalline silicon is grown on the first surface of MEMS substrate 10 having structured sacrificial layer 20 in a following epitaxy process, which is shown in FIG. 2. The thickness of cap layer 30 is in the order of magnitude of 20 μm to 50 μm. It forms a hermetic terminus for the micromechanical structure, which is still to be produced, and protects it against environmental influences and particles.

Figure 3:
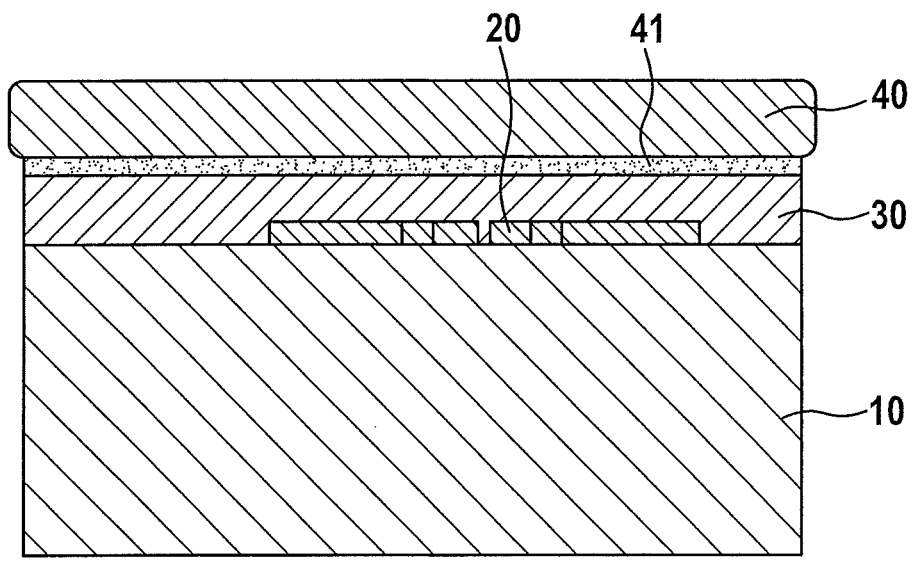

It is to be noted here that multiple cap layers may also be applied to the substrate surface having the structured sacrificial layer, so that the cap or cap structure is not made of only one layer, but rather a layered structure. For example, electrical connecting lines and/or circuit elements for signal detection may be integrated into such a layered structure. At least one conductive layer, for example, a doped polysilicon layer, is simply sandwiched between two insulating layers and structured accordingly for this purpose in the layered structure:

After the application of the at least one cap layer 30, MEMS substrate 10 is bonded face down, i.e., using cap layer 30, on a carrier 40. Carrier 40 is only used for fixing MEMS substrate 10, whose rear side is structured in a following processing sequence. It is removed again at the latest after the mounting of structured MEMS substrate 10 on the ASIC substrate. The connection between cap layer 30 and carrier 40 is therefore established with the aid of an adhesive layer 41, which does have a certain temperature stability, but may also be removed again without residue. Adhesive layer 41 is additionally flexible, so that a possibly existing topography in the surface of cap layer 30 is compensated for. FIG. 3 shows MEMS substrate 10 including structured sacrificial layer 20, cap layer 30, and carrier 40.

Figure 4:
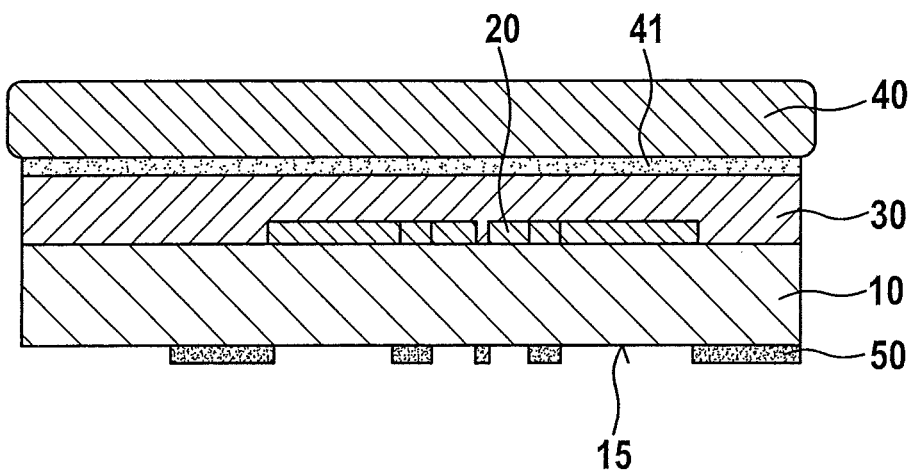

Relatively thick MEMS substrate 10 is now thinned until its thickness approximately corresponds to the intended structural height of the MEMS element. This height is typically in a range between 20 μm and 150 μm. For this purpose, rear side 15 of MEMS substrate 10 is first ground and then polished, in order to remove scratches and damage to the silicon crystal. The polishing process is additionally used for the purpose of preparing the roughness of the rear substrate surface 15 for the mounting of the MEMS element on the ASIC substrate. In the exemplary embodiment described here, the MEMS element is bonded on the ASIC substrate. For this purpose, a bond layer 50 is applied to substrate rear side 15 thus prepared and structured, as shown in FIG. 4.

Figure 9:
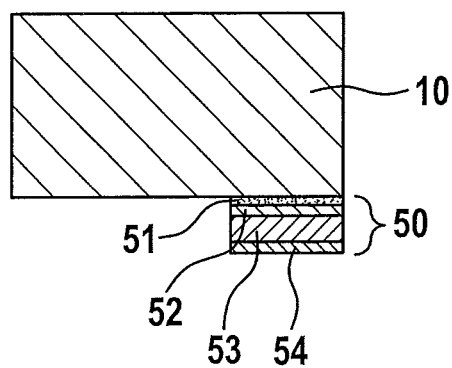
FIG. 9 shows a detail view of a semiconductor substrate having a bond layer.

The manufacturing of such a bond layer will be described in greater detail in conjunction with FIG. 9, which shows the structure of bond layer 50 in detail. A barrier layer 51, for example, Ta/TaN or Ti/TiN, and optionally one or multiple adhesive layers are initially applied to the rear substrate surface and a thin copper layer 52 is deposited over them via PVD or sputtering processes. A lacquer layer is then applied to thin copper layer 52 and photolithographically structured, to thicken copper layer 52 in the unmasked areas by galvanic deposition. The resulting layer growth is identified here by reference numeral 53. In the exemplary embodiment described here, a tin (Sn) layer 54 was finally applied, which also only grows in the unmasked surface areas. The lacquer mask as well as the thin copper layer and the barrier layer were then removed in the areas below the lacquer mask, for example, in a wet-chemical back etching process. Layers 51 through 54 thus structured are referred to hereafter as structured bond layer 50. The following process steps may make it necessary for additional protective layers to be applied to bond layer 50, in order to passivate the bond layer against subsequent processes. These protective layers are not set forth separately here.

Figure 5:
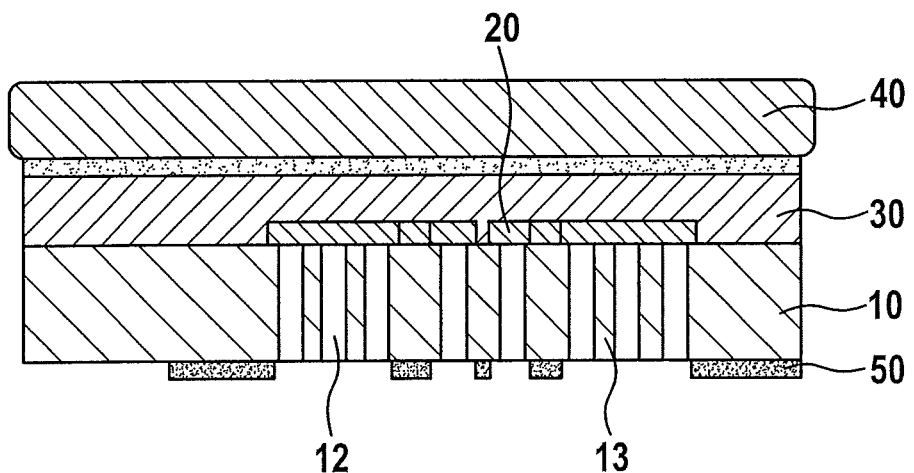

The rear side of MEMS substrate 10 having structured bond layer 50 is now provided with an etching mask for the subsequent anisotropic etching process, during which a micromechanical sensor structure is introduced into MEMS substrate 10. A trenching process may be selected as the etching process, since structures having a particularly high aspect ratio may be produced using this method. Specifically, within the scope of the method according to the present invention, MEMS structures which extend over the entire thickness of the MEMS substrate are to be produced on a relatively small chip surface. A structured photoresist layer may be used as the trenching mask. In the case of particularly high etching depths, i.e., in the case of thicker MEMS substrates, however, it is advisable to use an oxide mask. FIG. 5 shows structured MEMS substrate 10 after the removal of the trenching mask. In the present case, the micromechanical sensor structure includes one or multiple resiliently suspended seismic masses 13, which are defined and exposed by trenches 12 in MEMS substrate 10. These trenches 12 extend from the substrate rear side through the entire thickness of MEMS substrate 10 up to sacrificial layer 20, which has also been used here as an etch stop for the trenching process.

Figure 6:
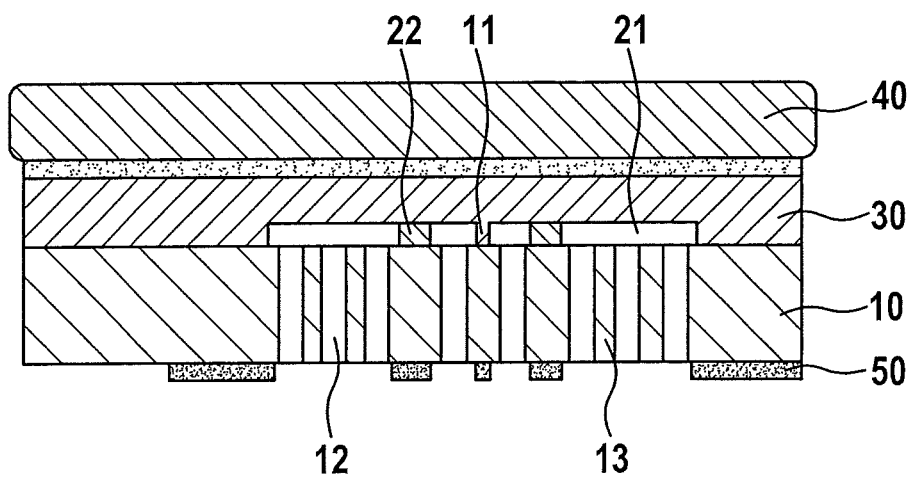

In a next method step, sacrificial layer 20 is partially removed to expose seismic masses 13 and thus allow their deflection. A cavity 21 results between cap layer 30 and the micromechanical sensor structure. Remaining areas 22 of oxide layer 20 form a mechanical connection of the micromechanical sensor structure to cap layer 30, which is shown in FIG. 6. In the exemplary embodiment shown here, the micromechanical sensor structure is additionally also directly connected to cap layer 30, specifically at connection point 11, which is to be attributed to the structuring of oxide layer 20. The sacrificial layer material was removed in an etching attack, which took place via trenches 12, for example, by etching using HF from the gas phase. The surface of the micromechanical sensor structure may then also be coated using an organic anti-adhesive layer, in order to prevent adhesion of the seismic mass to adjacent structure elements.

Figure 7:
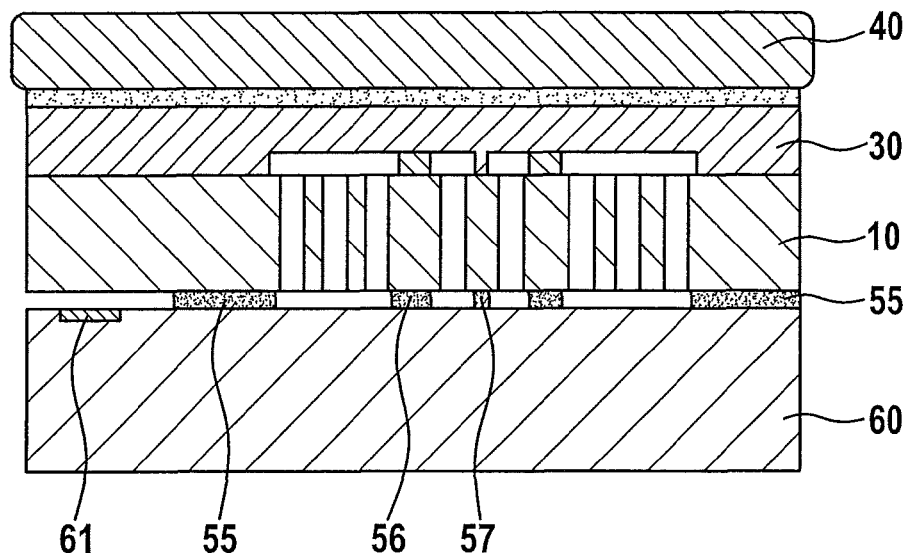

MEMS substrate 10 thus processed is now bonded to ASIC substrate 60, which is processed independently thereof. For this purpose, the surface of ASIC substrate 60 was provided with a copper layer or also with a copper/tin layer, which was structured corresponding to bond layer 50 on the rear side of MEMS substrate 10. Such a copper layer on the surface of ASIC substrate 60 may be part of the electrical wiring of ASIC substrate 60. In this case, this copper layer must only be conditioned for the bonding process in a suitable way. During the metallic bonding process, MEMS substrate 10 is permanently connected to ASIC substrate 60, as shown in FIG. 7. Both purely mechanical connecting points, for example, a bond frame 55, and also electrical contacts 56 and 57 are formed between the two elements 10 and 60. The micromechanical sensor structure is advantageously hermetically sealed by bond connection 55 to ASIC substrate 60, a defined internal pressure being able to be set in the resulting cavity between ASIC substrate 60 and cap layer 30. In addition, the possibility exists of also electrically connecting cap structure 30 to ASIC substrate 60 via bond connection 55, 56, 57 between MEMS substrate 10 and ASIC substrate 60.

The above-described bond connection between MEMS substrate 10 and ASIC substrate 60 may be established in a bonding process, which is based on the SLID (solid liquid interdiffusion) or the TLP (transient liquid phase) method. The fact that an intermetallic phase forms between copper and tin, for example, $Cu_3Sn$, is utilized in this case. This intermetallic phase has a higher melting point than the actual bonding temperature which was required to form this phase.

Alternatively thereto, a bonding process which is based on thermocompression may also be used. The two wafers, MEMS substrate and ASIC substrate, are permanently connected to one another with the aid of a typical wafer bonder under the application of temperature and pressure. A tin intermediate layer is not required here. The wafer stack may subsequently be held for a certain time at an elevated temperature to increase the strength of this copper-copper connection.

In another assembly variant, the permanent connection between the MEMS substrate and the ASIC substrate is established in a eutectic bonding process via a germanium-containing layer on the rear side of MEMS substrate 10 and a correspondingly structured aluminum layer on the surface of the ASIC substrate. For this purpose, a germanium layer and/or a silicon-germanium layer is/are deposited on the rear side of MEMS substrate 10, for example, via a sputtering process (physical vapor deposition) or from the gas phase by PECVD or LPCVD. This layer is then structured in a wet-chemical etching method or by plasma etching. The aluminum layer on the surface of the ASIC substrate may be part of the electrical wiring of the ASIC substrate. In this case, it must only be conditioned in a suitable way for the bonding process. It may be made of aluminum, aluminum having a copper content of 0.5%, or aluminum having a copper content of 0.5% and a silicon content of 1%.

After the mounting of processed MEMS substrate 10 on ASIC substrate 60, carrier 40, which was only used within the scope of the manufacturing method, is removed from the wafer stack again, by dissolving adhesive layer 41. After the bonding step, the wafer composite has a sufficient stability for further processing using wafer processes.

Figure 8A:
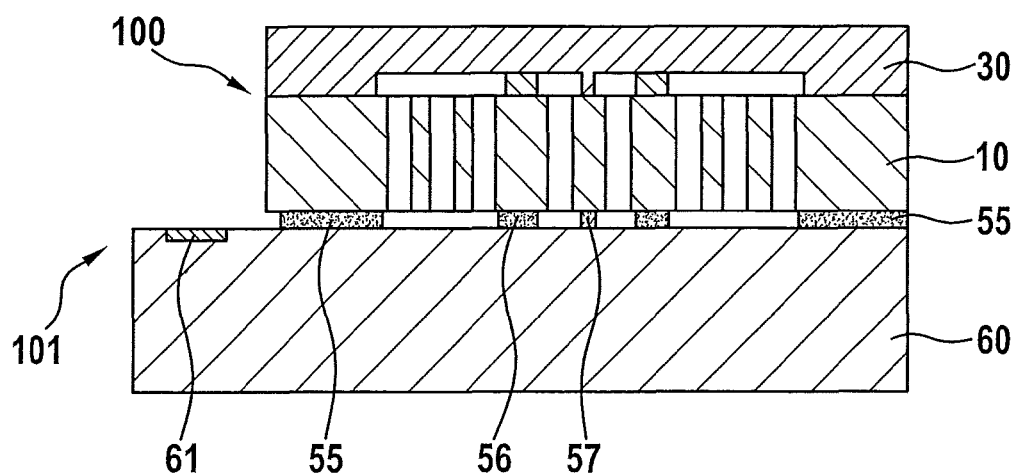
FIGS. 8a, 8b show two different possibilities for the external electrical contacting of an inertial sensor component manufactured according to the present invention on the basis of schematic sectional views.

Such components are frequently electrically contacted via wire bonds within the scope of the second-level assembly. In the case of component 101 shown in FIG. 8a, electrical contact pads 61 are implemented for this purpose on the surface of ASIC substrate 60. The material of MEMS element 100 over contact pads 61 was removed in a sawing or etching process, in order to expose contact pads 61 and thus allow external contacting of component 101 via wire bonds.

Alternatively to external contacting with the aid of wire bonds, through contacts, so-called TSVs (through silicon vias) may be implemented using copper, for example, in the ASIC substrate, via which the electrical signals of the component are guided to the outside. This component variant is not shown here.

Figure 8B:
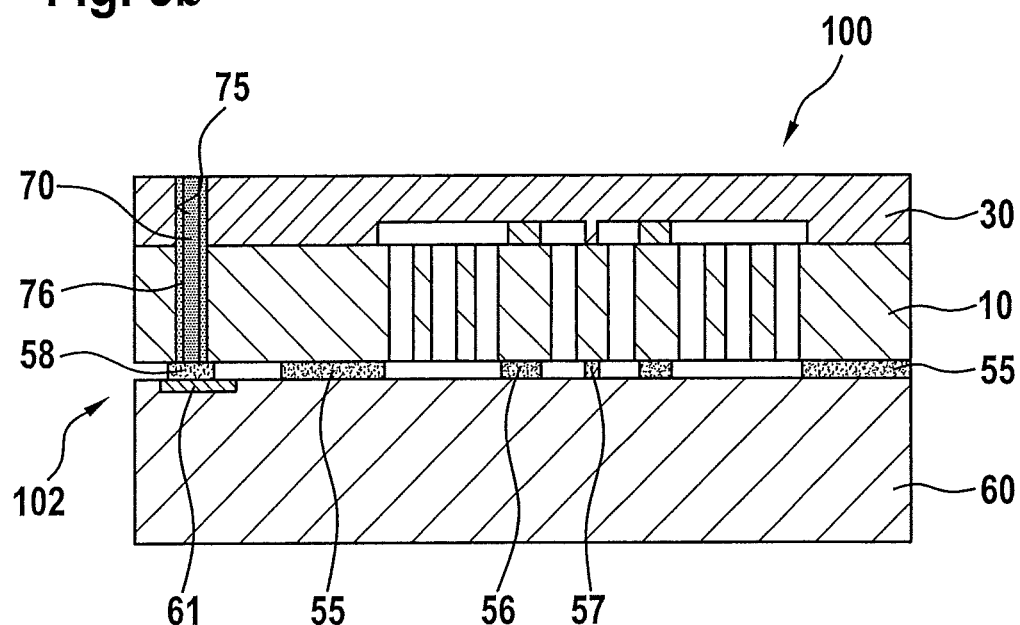

Such TSVs may also be formed in the MEMS substrate and the layered structure on the MEMS substrate, so that not only the MEMS element but rather the entire component may be electrically contacted via the cap. This component variant 102 is shown in FIG. 8b.

After the thinning and before the deposition and structuring of bond layer 50, circular TSV openings 75 having an aspect ratio of 5:1 to 10:1 were etched here into the rear side of MEMS substrate 10. TSV openings 75 extend from substrate rear side 15 through cap layer 30 up to its surface. The walls of these TSV openings 75 were coated using an oxide layer 76 for the electrical insulation against the adjoining semiconductor material. As described in conjunction with FIG. 9, a bond layer 50 was subsequently produced. During the galvanic deposition of copper to thicken the thin copper layer, TSV openings 75 were also completely filled with copper 70. This copper filling 70 of the TSV openings 75 forms, after the mounting of MEMS element 100 on ASIC substrate 60, together with bond layer 58, an electrically conductive connection between terminal pad 61 on the surface of ASIC substrate 60 and the cap surface, via which the electrical signals of ASIC substrate 60 may be guided to the outside.

Component 102 may therefore be processed further using processes of wafer level packaging (WLP), for example, flip-chip assembly, and is suitable for direct mounting on circuit boards.

The TSVs may alternatively also first be applied after the wafer bonding.

What is claimed is:

1. A method for manufacturing a hybrid integrated component, having a MEMS element, a cap for the micromechanical structure of the MEMS element, and an ASIC substrate, the method comprising:
  manufacturing in a layered structure a micromechanical structure of the MEMS element and the cap for the micromechanical structure of the MEMS element, proceeding from a shared semiconductor substrate, by performing the following:
    applying at least one cap layer to a first surface of the semiconductor substrate, wherein at least one sacrificial layer is applied to the first surface of the semiconductor substrate and structured so that it forms a space holder for a cavity between the MEMS structure and the cap, and the at least one cap layer is applied over and contacts the at least one structured sacrificial layer on the first surface of the semiconductor substrate, and processing and structuring the semiconductor substrate proceeding from its other second surface, to produce and expose the micromechanical MEMS structure; and mounting the semiconductor substrate with the MEMS-structured second surface on the ASIC substrate.

2. The method of claim 1, wherein the cap is implemented in a layered structure which includes at least one electrically conductive layer, and wherein the electrically conductive layer is structured to form at least one of connecting lines, a rewiring, and circuit elements for signal detection.

3. The method of claim 1, wherein the semiconductor substrate is thinned proceeding from its second surface down to a structural height of the MEMS structure.

4. The method of claim 1, wherein the MEMS structure is introduced in a trenching process into the second surface of the semiconductor substrate, and wherein the structured sacrificial layer on the first surface of the semiconductor substrate is used as an etch stop.

5. The method of claim 4, wherein the MEMS structure is exposed and a cavity is produced between the MEMS structure and cap, by at least partially removing the material of the at least one sacrificial layer in the second surface of the semiconductor substrate via the trenches.

6. The method of claim 1, wherein the mechanical and electrical connection between the MEMS element having the cap and the ASIC substrate is established in a bonding process.

7. The method of claim 6, wherein the connection between the MEMS element and the ASIC substrate is established via at least one of an AlGe bond layer, a CuCu bond layer, a CuSn bond layer, and an AuSi bond layer.

\* \* \* \* \*